United States Patent [19]
Bakhoum

[11] Patent Number: 5,408,186
[45] Date of Patent: Apr. 18, 1995

[54] SINGLE-CONDUCTOR WRIST STRAP MONITORING

[76] Inventor: Ezzat G. Bakhoum, P.O. Box 2818, Durham, N.C. 27715-2818

[21] Appl. No.: 131,692

[22] Filed: Oct. 5, 1993

[51] Int. Cl.⁶ .......................................... G01R 27/26
[52] U.S. Cl. .................................. 324/509; 361/212; 340/649
[58] Field of Search ................ 324/509, 555; 340/649, 340/650; 361/212, 220

[56] References Cited

U.S. PATENT DOCUMENTS

| | | | |
|---|---|---|---|
| 4,415,850 | 11/1983 | Sherwood | 361/212 |
| 4,558,309 | 12/1985 | Antonevich | 340/649 |
| 4,605,984 | 8/1986 | Fiedler | 361/220 |
| 4,638,399 | 1/1987 | Maroney et al. | 361/220 |
| 4,639,825 | 1/1987 | Breidegam | 361/212 |
| 4,649,374 | 3/1987 | Hoigaard | 340/573 |
| 4,710,751 | 12/1987 | Webster | 340/522 |
| 4,745,519 | 5/1988 | Breidegam | 361/220 |
| 4,785,294 | 11/1988 | Campbell | 340/649 |
| 4,800,374 | 1/1989 | Jacobson | 340/649 |
| 4,813,459 | 3/1989 | Breidegam | 139/421 |
| 4,859,992 | 8/1989 | Hoigaard | 340/649 |
| 5,057,965 | 10/1991 | Wilson | 361/212 |
| 5,083,117 | 1/1992 | Hoigaard | 340/649 |
| 5,164,674 | 11/1992 | Bakoum | 324/509 |
| 5,179,497 | 1/1993 | Bakhoum | 361/212 |
| 5,247,420 | 9/1993 | Bakhoum | 361/212 |

Primary Examiner—Maura K. Regan

[57] ABSTRACT

A device for monitoring the continuity of a single-conductor wrist-strap, which may be used for monitoring the integrity of the electrical connection between a person's body and the ground.

The device is based on a phenomenon known as the "mains hum" inside the human body, which is the presence of several volts of 60 Hz AC inside the human body. The presence of such voltage inside the human body can be used to trigger some special types of electronic circuits. Such effect, in turn, can be used as an indication of the presence of the human body.

21 Claims, 2 Drawing Sheets

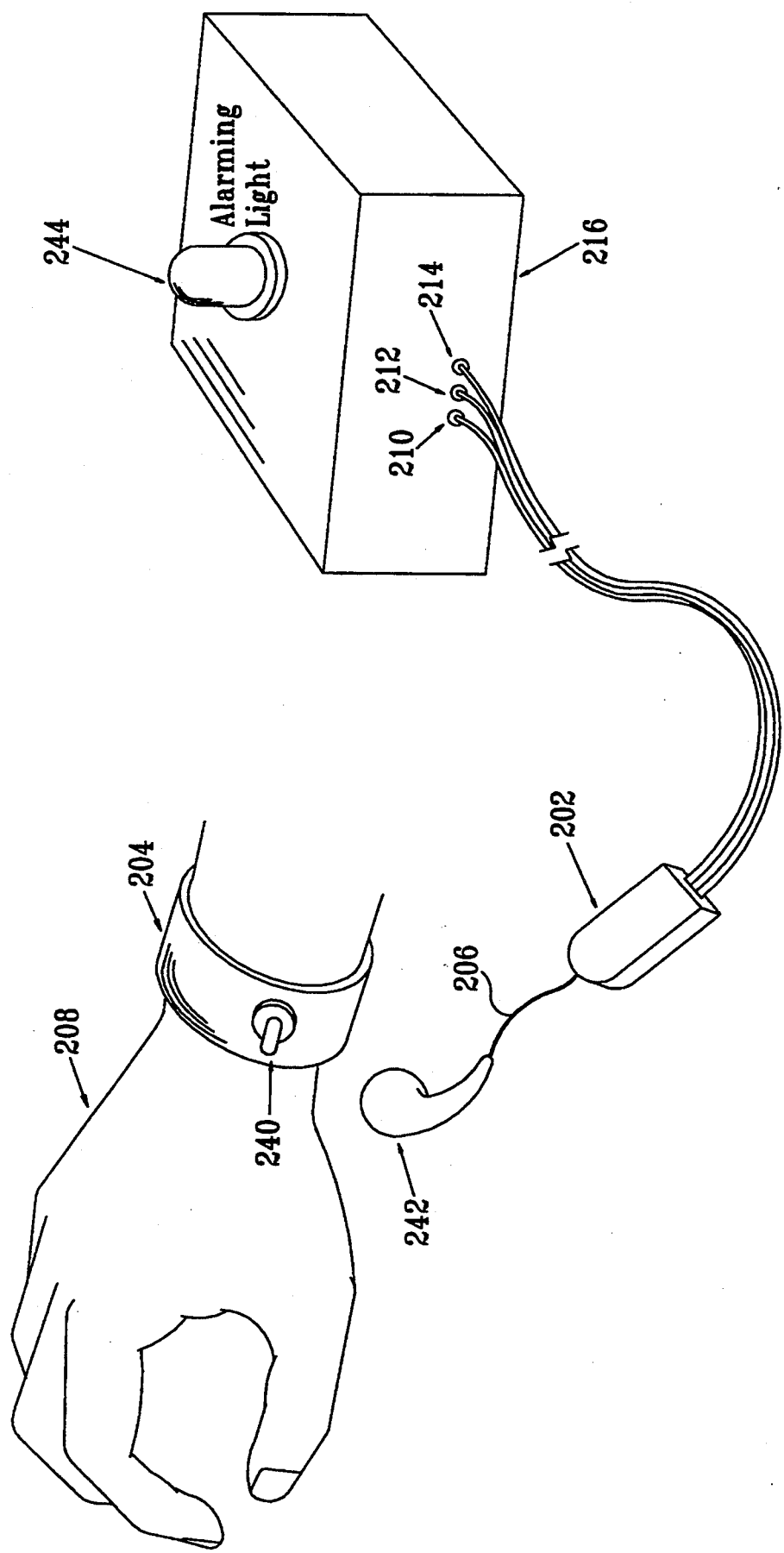

SINGLE-CONDUCTOR WRIST STRAP MONITORING

BACKGROUND OF THE INVENTION

1. Field of the Invention

This invention relates to a device for monitoring the continuity of a wrist-strap connection, and particularly a device of such type which is useful for monitoring single-conductor wrist straps.

2. Description of the Related Art

A famous gadget used by the electronics industry worldwide is known as the "wrist-strap". Essentialy, a wrist-strap is a piece of wire, or a plurality of wires, used to preclude the build-up of static electricity on personnel by "grounding" the human body, i.e., by attaching the human body to earth via the wrist.

In the past, single-wire wrist straps were used extensively. However, in the recent years such straps were quickly phased-out and replaced by two-wire straps, as it was found out that no means existed to monitor the continuity of the wrist-strap connection; i.e., to monitor the validity of the connection between the human body and the earth, with a single-wire system.

As it was found-out, it was necessary to use at least two wires in order to monitor the continuity of such connection. This is typically achieved by means of circulating a current from the ground point to the human body, via the first wire, and then back from the body to the ground point, via the second wire, thereby establishing a closed current loop. Means was then inserted into the loop in order to detect the continuous presence of the current. Any discontinuity in the current would then mean a broken connection. This idea can be found in two key patents: U.S. Pat. No. 4,605,984 issued to Robert Fiedler and assigned to Beckman Industries, and the group of U.S. Pat. Nos. issued to Albert Breidegam (4,639,825, 4,745,519, 4,813,459) and assigned to Semtronics Corp.

The Fiedler patent shows an AC source being used to circulate a current through the closed loop formed by two wires, where an LCD display senses the presence of the AC signal as an indication of continuity. The Breidegam patents show essentially the same idea being used in conjunction with a DC circuit. The Breidegam patents further show the possibility of testing the resistance of the skin of the wearer to ensure that the wrist-strap is in firm contact with the body of the wearer.

This prior-art idea, while useful for continuous monitoring of the wrist-strap connection, has several deficiencies: first, since the continuity of the loop requires that the current flows to the strap, then to the skin of the user, and then back to the strap, this makes the design of the wrist-strap assembly complicated, and hence more expensive. Secondly, since the user must maintain good electrical contact with two conductors inside the strap, instead of one, the wrist-strap must be very tightly :secured around the wrist of the wearer all the time, which is an annoying requirement for most users.

Another well known device, manufactured by Pilgrim Corp., is based on the idea of detecting the capacitance of the human body in order to ensure continuous presence of the body. This idea is not very popular due to the fact that capacitance measurement is very sensitive to noise, and hence unreliable.

It is the objective of the present invention to overcome the deficiencies of the prior-art by providing a successful device for wrist-strap monitoring which is useful for single-conductor wrist-straps. Such device reduces the cost and the complexity associated with two-conductor straps. It is another objective of the present invention to provide a wrist-Strap monitoring system which is very flexible and convenient for the user, yet efficient and reliable.

Other objectives and features of the invention will become fully apparent from the ensuing disclosure and appended claims.

SUMMARY OF THE INVENTION

In a broad aspect, the present invention relates to a device for monitoring the continuity of a single-conductor wrist-strap.

The device is based on a phenomenon known as the "mains hum" inside the human body. The mains hum is the presence of several volts of 60 Hz AC inside the human body, which is derived from the mains power network inside buildings. The presence of such voltage inside the human body can be used to trigger some special types of electronic circuits. Such effect, in turn, can be used as an indication of the presence of the human body.

BRIEF DESCRIPTION OF THE DRAWINGS

FIG. 2 is a perspective view of the preferred embodiment of the present invention, as employed to monitor the continuity of a wrist-strap connection.

DETAILED DESCRIPTION OF THE INVENTION, AND PREFERRED EMBODIMENTS THEREOF

Figure 1:
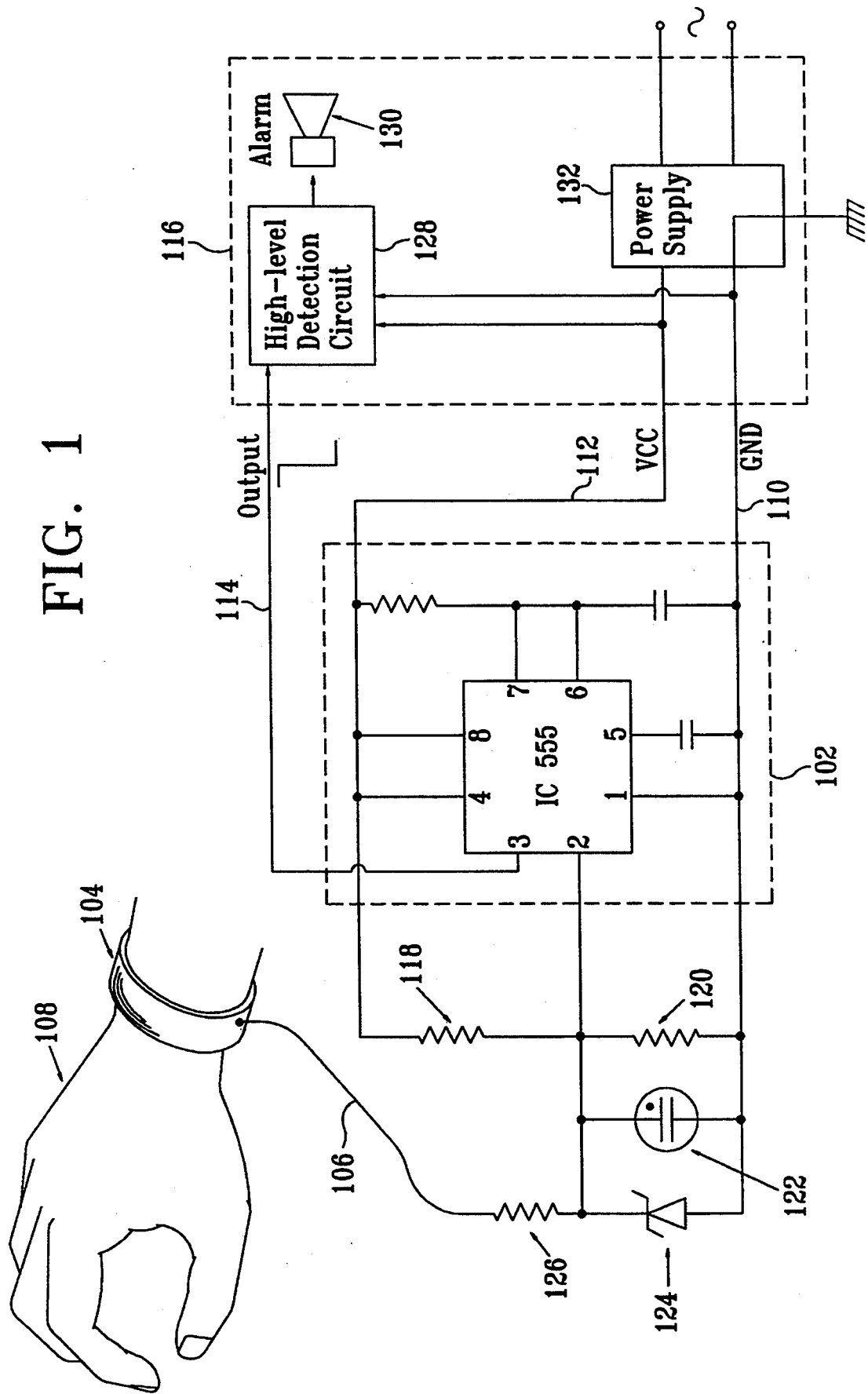
FIG. 1 is a detailed circuit diagram showing the principle of operation of the present invention.

The present invention is based on a phenomenon known as the "mains hum" inside the human body.

Inside buildings, every individual has several volts of 60 Hz AC on his/her body, since the human body acts like a large "antenna" that picks up the 60 Hz signal from the mains power network. It has been known for at least 20 years that such voltage can be used to trigger some special types of electronic circuits.

This phenomenon has been used in the past; for various applications, such as switching TV sets, where touch-activated electronic switches replaced conventional mechanical switches. Such applications, however, quickly failed in the marketplace, since, as it was discovered, successful triggering of a touch-activated switch requires the presence of moisture on the finger of the user; since moisture is the only means for current to flow out of the body. Of course, in dry weather conditions, the lack of moisture on the skin of individuals prohibited successful operation of devices based on such principle.

This deficiency in the mains hum switching technique will be the principle on which the present invention is based. Since moisture on the skin of an individual is the only means for current to flow out of the body, such condition is an excellent condition for the discharge of static build-up on the body. If, then, the lack of moisture will prevent the triggering of an electronic circuit, then such principle can be used to indicate an inadequate electrical connection with the skin, and hence inadequate conditions to preclude the build-up of static charges on the human body.

FIG. 1 shows a system for monitoring the continuity of a wrist-strap, as a preferred embodiment of the present invention. The system comprises a touch-sensitive circuit 102, connected to wrist-strap 104 via a conductive path 106. The circuit 102 is one of the many known types which can be triggered by the presence of a mains hum signal on human body 108, and is described more fully in "IC 555 Projects", by E. A. Parr, Babani Publishing, U.K., page 100. The circuit 102 is connected by means of three wires 110, 112, and 114, to a monitoring unit 116. The three wires are, respectively: Ground, Vcc, and Output. The Ground wire 110 is the earthing wire for the system, while the Vcc wire 112 carries a DC signal to activate the circuit 102. The output wire 114 carries the output signal of circuit 102, which can be either High or Low.

When mains hum is detected on the human body, the output 114 is High, otherwise the output is Low.

Two major obstacles must now be overcomed: first, the system must be immune to noise; secondly, the system must allow for the discharge of static build-up on body 108.

The immunity to noise problem is solved by means of two resistors 118 and 120, having a relatively low impedance, e.g., 10–100MΩ. This configuration will establish a reference potential for the conductive path 106, which will prevent wire 106 from acting like an antenna and falsely triggering the circuit. Further, the wire 106 can be made shorter by placing the whole circuit 102 and its associated components in a position very close to the wrist-strap 104. Such configuration is shown in FIG. 2, where the sensitive circuit and its associated components are placed inside a housing 202, from which wire 206 emerge. The wire 206 can be connected to a wrist-strap 204 by means of a flexible joint comprising a male connector 240 and a female connector 242.

For establishing a discharge path from the human body to earth, an element must be included in the circuit such that the operation of the circuit is not disturbed under normal conditions, but if a static charge develops, a very low-impedance path from body 108 to the ground point 110 is created instantaneously. Such element can suitably be a neon indicator, and is shown in FIG. 1 as element 122. Under normal conditions, the impedance of such element is much higher than resistor 120. If, however, a static charge develops on body 108, the neon gas in element 122 breaks down instantaneously, and the body is discharged. However, since such neon indicators require at least 50 volts to break down, a further enhancement is necessary in order to render the circuit more reliable for very low voltages on the human body. Such enhancement can suitably be a Zener diode 124 that is mounted in parallel with the neon indicator, with the Zener voltage being higher than the reference voltage of terminal 106. For example, the reference voltage of terminal 106 may be 2.5 volts, while the nominal Zener voltage is 3 volts.

An optional resistor 126 can be incorporated into the discharge path 106. This resistor, suitably a 1MΩ resistor, is commonly used in wrist-strap assemblies in order to protect the wearer from electrocution in the event that the strap is inadvertently connected to a voltage source instead of a ground point. In FIG. 2, such resistor is housed inside the enclosure 202 together with the other components.

The monitoring unit 116 is a stand-alone, external unit, and performs the function of monitoring the output signal on line 114. As shown, the output signal is fed to a High-level detection circuit 128. The circuit 128 may be any of the widely known circuits for performing such function; e.g., it may comprise a camparator chip. If a High voltage is not detected on line 114, the circuit 128 triggers an alarm unit 130, which may be audio, visual, or a combination of both. The monitoring unit 116 comprises a power supply 132 for generating a DC signal for itself and for the sensitive circuit 102. In FIG. 2, the monitoring unit is unit 216. As shown, three wires 210, 212, and 214 emerge from the unit and are connected to the sensitive circuit inside the enclosure 202. The monitoring unit 216 may feature a lamp or light-emitting diode 244 as a visual alarming means.

From the foregoing, it will be apparent how the device of FIG. 1 operates: if the mains hum signal on the human body is not detected due to the lack of moisture on the skin of the user, or if the connecting line 106 is broken as a result of mechanical abuse, the output of circuit 102 will be Low, and the alarm will trigger. Further, if any of the wires 110 or 112 is broken, the sensitive circuit 102 will not function, and a High signal will not be detected. Similarly, if wire 114 is broken, the output will not be detected and the alarm will trigger.

Therefore, it is clear that the device of FIG. 1 performs two functions: first, it monitors the condition of the electrical contact between the user's skin and the discharge terminal 106; secondly, it monitors the integrity of all connecting wires, including the ground wire, and triggers the alarm in case any wire is broken as a result of mechanical abuse.

It will be now apparent to those skilled in the art that the device of the present invention is a device for monitoring the continuity of an electrical connection between the human body and a grounding terminal, and is based on the fundamental concept of detecting the mains hum on the human body. The device of the invention can be used with single, dual, and multi-conductor wrist-straps. In addition, it will be recognized that the principle behind the device is essentially useful for monitoring a connection with the wrist, foot, or any other part of the body, without departure from the scope of the invention.

It will be further recognized that while the sensitive circuit 102 and its associated components are housed inside an enclosure placed in close proximity to the human body as a preferred embodiment (as shown in FIG. 2), it is possible to enclose that circuit inside the monitoring unit 216 itself, without any departure from the scope of the invention.

Accordingly, while the invention has been described with reference to specific aspects, features, and embodiments, it will be appreciated that various modifications, alternatives, and other embodiments are possible within the broad scope of the invention, and the invention therefore is intended to encompass all such modifications, alternatives, and other embodiments, within its scope.

What is claimed is:

1. A device for monitoring the continuity of an electrical connection between a human body and a grounding terminal, comprising:

a conductive body-contact means for establishing electrical contact with the body;

a circuit connected to the body-contact means for detecting the presence of a mains hum signal on the human body, and for providing an output indicative of such presence;

means for sensing the output of the mains hum detection circuit and for alarming when the output is not provided.

2. A device according to claim 1, wherein the mains hum detection circuit and the alarming means are housed within the same enclosure.

3. A device according to claim 1, wherein the mains hum detection circuit and the alarming means are housed inside separate enclosures.

4. A device according to claim 1, wherein the mains hum detection circuit is placed in close proximity to the human body to minimize the effects of noise.

5. A device according to claim 1, wherein the mains hum detection circuit comprises an IC 555 device.

6. A device according to claim 1, wherein the mains hum detection circuit comprises two resistors for establishing a reference potential.

7. A device according to claim 1, wherein the electrical connection between the human body and the grounding terminal comprises a neon indicator.

8. A device according to claim 1, wherein the electrical connection between the human body and the grounding terminal comprises a Zener diode.

9. A device according to claim 1, Wherein the electrical connection between the conductive body-contact means and the mains hum detection circuit comprises a safety resistor.

10. A device according to claim 1, wherein the mains hum signal is detected due to the presence of moisture on the skin of the user.

11. A device according to claim 1, wherein the sensing and alarming means comprises a comparator circuit.

12. A device according to claim 1, wherein the sensing and alarming means comprises an audible alarm.

13. A device according to claim 1, wherein the sensing and alarming means comprises a visual alarm.

14. A device according to claim 1, constructed and arranged for monitoring the integrity of the grounding terminal.

15. A device according to claim 1, constructed and arranged for monitoring the integrity of all connecting wires.

16. A device according to claim 15, wherein the output of the mains hum detection circuit is not provided if any of the connecting wires is broken.

17. A device according to claim 1, constructed and arranged for monitoring the connection with a single-conductor wrist-strap.

18. A device according to claim 1, constructed and arranged for monitoring the connection with a dual-conductor wrist-strap.

19. A device according to claim 1, powered from an AC source.

20. A device according to claim 1, powered from a DC source.

21. A device according to claim 1, wherein the grounding terminal is connected to earth via utility ground.

* * * * *